US010249972B1

(12) United States Patent
Lim et al.

(10) Patent No.: US 10,249,972 B1
(45) Date of Patent: Apr. 2, 2019

(54) VERTICALLY STACKING CIRCUIT BOARD CONNECTORS

(71) Applicant: GOOGLE LLC, Mountain View, CA (US)

(72) Inventors: David Kyungtag Lim, Glenview, IL (US); Michael John Formenti, Lisle, IL (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/713,386

(22) Filed: Sep. 22, 2017

(51) Int. Cl.
*H01R 12/00* (2006.01)
*H01R 12/78* (2011.01)
*H01R 12/79* (2011.01)
*H01R 12/77* (2011.01)
*H01R 13/24* (2006.01)

(52) U.S. Cl.
CPC ........... *H01R 12/78* (2013.01); *H01R 12/772* (2013.01); *H01R 12/79* (2013.01); *H01R 12/777* (2013.01); *H01R 13/2407* (2013.01)

(58) Field of Classification Search
CPC ...... H01R 12/78; H01R 12/772; H01R 12/79; H01R 12/777; H01R 13/2407
USPC ...... 439/76.1, 74, 77, 492, 67; 361/749, 789
See application file for complete search history.

(56) References Cited

U.S. PATENT DOCUMENTS

| 3,551,750 | A | 12/1970 | Sterling |
| 3,716,846 | A | 2/1973 | Volckart et al. |
| 4,695,258 | A | 9/1987 | Hanson et al. |
| 5,026,291 | A | 6/1991 | David |
| 5,378,160 | A | 1/1995 | Yumibe et al. |
| 5,605,477 | A | 2/1997 | Wu et al. |
| 5,967,799 | A | 10/1999 | Arai |
| 7,819,673 | B2 | 10/2010 | Hirashima |
| 9,209,540 | B2 * | 12/2015 | Raff ............... H01R 12/716 |
| 9,590,338 | B1 | 3/2017 | Schmitt et al. |
| 9,763,343 | B2 * | 9/2017 | Kim ............... H05K 5/0047 |
| 2002/0086459 | A1 | 7/2002 | Nakahima |
| 2007/0126125 | A1 | 6/2007 | Rapport et al. |
| 2014/0302692 | A1 * | 10/2014 | Raff ............... H01R 12/716 439/65 |
| 2015/0194753 | A1 * | 7/2015 | Raff ............... H01R 12/716 439/75 |

(Continued)

OTHER PUBLICATIONS

International Search Report and Written Opinion issued in International Application No. PCT/US2018/033304, dated Sep. 10, 2018, 14 pages.

*Primary Examiner* — Abdullah A Riyami
*Assistant Examiner* — Nelson R Burgos-Guntin
(74) *Attorney, Agent, or Firm* — Fish & Richardson P.C.

(57) ABSTRACT

An electronic device including a stacked connector assembly is provided. In some embodiments, the electronic device includes: a first printed circuit board; a first electronic board-to-board connector mounted to the first printed circuit board; a second printed circuit board; a second electronic board-to-board connector mounted to the second printed circuit board and connected to the first electronic board-to-board connector; a first stacked connector mounted to the second printed circuit board; a second stacked connector connected to the first stacked connector; and a biasing member. The biasing member may bias the first board-to-board electronic connector together with the second electronic board-to-board connector, and the first stacked connector together with the second stacked connector.

20 Claims, 6 Drawing Sheets

(56) References Cited

U.S. PATENT DOCUMENTS

| | | | |
|---|---|---|---|
| 2015/0351256 A1 | 12/2015 | Doering et al. | |
| 2016/0164062 A1* | 6/2016 | Liu | H01M 2/1022 |
| | | | 429/121 |
| 2016/0190719 A1* | 6/2016 | Brzezinski | H01R 12/73 |
| | | | 439/74 |
| 2016/0352032 A1* | 12/2016 | Park | H01R 12/771 |
| 2018/0115099 A1* | 4/2018 | Endo | H01R 12/778 |

\* cited by examiner

VERTICALLY STACKING CIRCUIT BOARD CONNECTORS

BACKGROUND

Electronic components, such as resistors, capacitors, sensors, and other integrated circuits, are often mounted to a printed circuit board to create a direct electronic connection to electrical traces that flow across the surface of or through the interior of the printed circuit board. However, in some cases the printed circuit board may not be large enough to accommodate direct mounting of some or all of the electronic components. In some instances, the printed circuit board may need to be reduced in size so that it will fit within an electronic device or relatively small dimensions. In some such circumstances, the circuit board will not provide sufficient space for creation of the necessary electronic connections required within an electronic device.

SUMMARY

In general, this document describes techniques for assembling electronic components in a manner that reduces the space occupied by electronic connectors on a circuit board within a computing device. This reduction in space is accomplished by effectively stacking two sets of connectors atop a single location on a circuit board, rather than positioning each set of connectors at distinct locations on the circuit board.

As an illustration, a computing device such as a smartphone may include a rigid circuit board on which a primary processor for the smartphone is mounted. Not all electronic components with which the processor communicates, however, may be located on the rigid circuit board. As such, a flexible circuit board (sometimes called a "flex") may route communication lines that originate from the processor to electronic components that are not mounted to the rigid circuit board. For example, the flexible circuit board may connect to the rigid circuit board to enable the processor to communicate with a touchscreen display device. The connection between the flexible circuit board and the rigid circuit board may be implemented with a set of male and female board-to-board connectors (e.g., a female connector mounted to the rigid circuit board and a male connector mounted to the flexible circuit board).

The board-to-board connector that is mounted to the flexible circuit board may be mounted near an end of the flexible circuit board, such that most of the flexible circuit board maybe extend away from the board-to-board connector to, for example, wrap around the rigid circuit board to connect to a display device on its other side. This extended portion of the flexible circuit board may pull on the board-to-board connectors absent any additional component that secures the board-to-board connectors in place, however. As such, a biasing component, such as compressible foam, may be placed over a location of the board-to-board connectors to hold the connectors in place.

In detail, the biasing component may be affixed to a housing of the smartphone and may press down on a portion of the flexible circuit board at which the board-to-board connector is located. From bottom-up, the arrangement of components may include the rigid circuit board, the board-to-board connector attached to the rigid circuit board, the board-to-board connector attached to the flexible circuit board, the flexible circuit board, the biasing component, and a housing of the computing device. Accordingly, the biasing component biases or pushes the flexible circuit board and thus the board-to-board connectors together to counteract any such pulling on the board-to-board connectors by the flexible circuit board.

In a space-saving implementation, an additional connection mechanism may be placed in the space occupied by the biasing material in the above-described example. Such an implementation can free up space on the rigid circuit board at which this additional connection mechanism would otherwise be located (allowing a reduction in size of the rigid circuit board). This additional connection mechanism may provide a connection between the rigid circuit board and another component, such as a connector to a battery, sensor, or different circuit board, and this additional connection mechanism may otherwise be located on the rigid circuit board. In the space-saving implementation, however, this connection between the rigid circuit board and the other component (battery/sensor/circuit) may be moved to the location of the biasing component, for example, by mounting one side of the connection mechanism at a location of the flexible circuit board that is opposite a location of the board-to-board connector (and the other side of the connection mechanism on the biasing component). This arrangement essentially creates a stack of connectors.

As such, the compressive foam may push two sets of connectors together instead of one. From bottom-up, this arrangement includes the rigid circuit board, a board-to-board connector mounted to the rigid circuit board, a board-to-board connector mounted to the flexible circuit board, the flexible circuit board, another connector mounted to the flexible circuit board at a location that opposes the connection of the board-to-board connector, a corresponding connector mounted to the compressive foam, the compressive foam, and a housing of the computing device to which the foam is mounted. In this space-saving implementation, two sets of connectors may occupy less space on the rigid circuit board when stacked together than if the two sets of connectors each occupied a separate space on the rigid circuit board.

This disclosure so far has referred to features using "up" and "down" terminology even though these terms may be considered arbitrary without a reference plane. In this disclosure, the major face of the circuit board to which the board-to-board connector is mounted (and which does not include the second set of connectors mounted thereto in a stack) forms a plane that defines the X and Y axes. Arising out of this plane at a location of the board-to-board connectors is the Z axis, and therefore components that are "up" or "above" this circuit board include the two sets of stacked connectors, the flexible circuit board, and the biasing component.

In some implementations, a connector located above the flexible circuit board may include the biasing component or at least a component thereof. For example, instead of the biasing component being a compressible foam and the connector being attached to that compressible foam, the connector could be a spring that itself provides the biasing force that is described above. In this example, the spring attaches to a housing or other component of the computing device and pushes down on and contacts its corresponding electronic connector that is mounted to the flexible circuit board. The force exerted by the spring also biases the flexible circuit board downward and maintains the board-to-board connectors seated properly and prevents damage to the board-to-board connectors and the connection points between the circuit boards and the board-to-board connectors. In some implementations, the spring may attach to the flexible circuit board and push upward against a corresponding connector that is mounted to a housing of the computing device (producing an opposing force that acts downward on the flexible circuit board and the board-to-board connectors).

In some implementations, the set of board-to-board connectors are situated on a first side of the flexible circuit board and the other set of connectors are situated on a second side of the flexible circuit board at a location that is opposite the set of board-to-board connectors. In this manner, the two sets of connectors are situated opposite each other on different sides of the circuit board. Electrical traces may route electrical signals between conductors/pins of the board-to-board connector on the bottom of the flexible circuit board to the conductors/pins of the connector on top of the circuit board using "vias" through the interior of the circuit board.

In some implementations, the set of board-to-board connectors and the other set of connectors are situated on a same side of the flexible circuit board, but the flexible circuit board is bent over so that both sets of connectors are stacked in the vertical direction. In this example, the flexible circuit board may be bent back over so same-sided portions of the flexible circuit board contact themselves at the location at which the connectors are stacked, or a component may be located between the same-sided portions of the flexible circuit board so that the same-sided portions contact the component rather than themselves—limiting the radius of the curve in the flexible circuit board and limiting potential damage to the flexible circuit board.

In these examples, the conductors in the board-to-board connectors (e.g., the pins, pads, or sleeves that establish the connection between the two connectors) are routed to two different sets of connectors at different locations on the flexible circuit board: (1) a first set of connectors that is stacked above the board-to-board connector (e.g., a set of connectors to which a battery/sensor/circuit board is connected), and (2) a second set of connectors that is located at the other end of the flexible circuit board (e.g., a set of connectors to which a display device is connected). As such, a first subset of the conductors in the board-to-board connector attached to the flexible circuit board are connected to electrical traces that route to the first set of connectors. A second subset of the conductors in the board-to-board connector attached to the flexible circuit board are connected to electrical traces that route to the second set of connectors. As such, the board-to-board connectors maybe include more connectors (and thus may be larger) than if the board-to-board connector was serving only a single set of connectors at an end of the flex, but the larger space occupied by the board-to-board connector on the rigid circuit board may still be less than the overall space that would be occupied if the set of connectors that is stacked above the board-to-board connectors were located directly on the rigid circuit board.

In some implementations, instead of the above-described board-to-board connectors connecting a rigid circuit board to a flexible circuit board, the circuit boards are both flexible or are both rigid.

In some implementations, the secondary set of connectors that are stacked above the board-to-board connectors are connected to electrical traces that do not route to pins of the board-to-board connectors, but instead route to pins of the connector at the other end of the flexible circuit board. In this sense, the flex is routing traces for two sets of connectors along its length (e.g., one set going to the board-to-board connector and one going to the stacked connectors, with both coming from the far end of the flexible circuit board).

The stacked connectors may therefore serve as conceptual destinations for signals coming from the other end of the flexible circuit board.

This disclosure provides some example embodiments for stacking connectors in the Z direction, typically to free up space in the X-Y plane of the circuit board and/or to permit a reduction in the X-Y size of a circuit board. Such an implementation locates an additional connector mechanism above the location of a set of board-to-board connectors, with a circuit board separating the two sets of connectors. This additional connector mechanism may itself provide a biasing force that maintains the board-to-board connector on the front side of the circuit board in retention with its corresponding board-to-board connector, or the additional connector mechanism may be mounted on a structure that provides the biasing force. In either event, the Z space above the set of board-to-board connectors may be utilized to reduce the X-Y space occupied on a circuit board, while still providing the biasing force that is helpful to limit stresses applied to the set of board-to-board connectors.

As additional description to the embodiments described below, the present disclosure describes the following embodiments.

Embodiment 1 is a mobile computing device, the device comprising: a first printed circuit board; a first electronic board-to-board connector mounted to the first printed circuit board; a second printed circuit board; a second electronic board-to-board connector mounted to the second printed circuit board and connected to the first electronic board-to-board connector; a first stacked connector mounted to the second printed circuit board; a second stacked connector connected to the first stacked connector; and a biasing member. The biasing member biases: (i) the first board-to-board electronic connector together with the second electronic board-to-board connector, and (ii) the first stacked connector together with the second stacked connector.

Embodiment 2 is the device of embodiment 1, wherein the first electronic board-to-board connector is connected to the second electronic board-to-board connector by a male-to-female connection mechanism.

Embodiment 3 is the device of embodiment 1 or 2, wherein the first electronic board-to-board connector is configured to connect to the second electronic board-to-board connector through movement in a direction transverse to a major face of the first circuit board; the first stacked connector is configured to connect to the second stacked connector through movement in the direction transverse to the major face of the first circuit board; the biasing member biases the first board-to-board electronic connector together with the second electronic board-to-board connector and the first stacked connector together with the second stacked connector by applying a biasing force in the direction transverse to the major face of the first circuit board.

Embodiment 4 is the device of any one of preceding embodiments, wherein the first printed circuit board is a rigid printed circuit board; and the second printed circuit board is a flexible printed circuit board.

Embodiment 5 is the device of any one of preceding embodiments, further comprising an electronic component connector mounted to the second printed electronic circuit board, wherein: the first electronic board-to-board connector includes a first plurality of conductors; the second electronic board-to-board connector includes a second plurality of conductors; the first plurality of conductors connect to the second plurality of conductors when the first electronic board-to-board connector is connected to the second electronic board-to-board connector; the first stacked connector includes a third plurality of conductors that are electrically connected to a first subset of the second plurality of conductors; and the electronic component connector includes a fourth plurality of conductors that are electrically connected to a second subset of the second plurality of conductors.

Embodiment 6 is the device of embodiment 5, wherein the first subset of the second plurality of conductors are electrically connected with the third plurality of conductors without being connected to a conductor of any other electronic connector.

Embodiment 7 is the device of any one of preceding embodiments, wherein: the first stacked connector includes a third plurality of multiple conductors; the second stacked connector includes a fourth plurality of multiple conductors; and the third plurality of multiple conductors connect with the fourth plurality of multiple conductors when the first stacked connector is connected together with the second stacked connector.

Embodiment 8 is the device of any one of preceding embodiments, wherein the second electronic board-to-board connector and the first stacked connector are mounted opposite each other on different sides of the second printed circuit board.

Embodiment 9 is the device of any one of preceding embodiments, wherein: the second electronic board-to-board connector and the first stacked connector are mounted on a same side of the second printed circuit board; the second printed circuit board is folded back over itself so that the second electronic board-to-board connector and the first stacked connector are vertically placed over a same location on a major face of the first printed circuit board.

Embodiment 10 is the device of embodiment 9, further comprising a support structure disposed between interior major surfaces of folded portions of the second printed circuit board.

Embodiment 11 is the device of any one of preceding embodiments, wherein first stacked connector or the second stacked connector comprises the biasing member.

Embodiment 12 is the device of any one of embodiments 1 through 10, wherein the first stacked connector or the second stacked connector is mounted to the biasing member.

Embodiment 13 is the device of any one of preceding embodiments, wherein the biasing member biases the first board-to-board electronic connector together with the second electronic board-to-board connector by applying a biasing force to the first stacked connector that biases the first printed circuit board and thus biases the first board-to-board electronic connector together with the second electronic board-to-board connector.

Embodiment 14 is an assembly of electrical components, the assembly comprising: a first printed circuit board is a rigid printed circuit board; a first electronic board-to-board connector mounted to the first printed circuit board; a second printed circuit board is a flexible printed circuit board; a second electronic board-to-board connector mounted to the second printed circuit board and connected to the first electronic board-to-board connector using a male-to-female connection mechanism; a first stacked connector mounted to the second printed circuit board; and a second stacked connector connected to the first stacked connector; wherein the first electronic board-to-board connector is configured to connect to the second electronic board-to-board connector through movement in a direction transverse to a major face of the first circuit board; the first stacked connector is configured to connect to the second stacked connector through movement in the direction transverse to the major face of the first circuit board; and wherein a biasing member biases by applying a biasing force in the direction transverse to the major face of the first circuit board: (i) the first board-to-board electronic connector together with the second electronic board-to-board connector, and (ii) the first stacked connector together with the second stacked connector.

Embodiment 15 is the assembly of embodiment 14, further comprising an electronic component connector mounted to the second printed electronic circuit board; and wherein: the first electronic board-to-board connector includes a first plurality of conductors; the second electronic board-to-board connector includes a second plurality of conductors; the first plurality of conductors connect to the second plurality of conductors when the first electronic board-to-board connector is connected to the second electronic board-to-board connector; the first stacked connector includes a third plurality of conductors that are electrically connected to a first subset of the second plurality of conductors; and the electronic component connector includes a fourth plurality of conductors that are electrically connected to a second subset of the second plurality of conductors.

Embodiment 16 is the assembly of embodiment 14, wherein the first subset of the second plurality of conductors are electrically connected with the third plurality of conductors without being connected to a conductor of any other electronic connector.

Embodiment 17 is the assembly of any one of embodiments 14 through 16, wherein: the first stacked connector includes a third plurality of multiple conductors; the second stacked connector includes a fourth plurality of multiple conductors; and the third plurality of multiple conductors connect with the fourth plurality of multiple conductors when the first stacked connector is connected together with the second stacked connector.

Embodiment 18 is the assembly of any one of embodiments 14 through 17, wherein first stacked connector or the second stacked connector comprises the biasing member.

Embodiment 19 is the assembly of any one of embodiments 14 through 18, wherein the biasing member biases the first board-to-board electronic connector together with the second electronic board-to-board connector by applying a biasing force to the first stacked connector that biases the first printed circuit board and thus biases the first board-to-board electronic connector together with the second electronic board-to-board connector.

Embodiment 20 is an assembly of electrical components, the assembly comprising: a first printed circuit board; a first electronic board-to-board connector mounted to the first printed circuit board; a second printed circuit board; a second electronic board-to-board connector mounted to the second printed circuit board and connected to the first electronic board-to-board connector using a male-to-female connection mechanism; a first stacked connector mounted to the second printed circuit board; and a second stacked connector connected to the first stacked connector; wherein the second electronic board-to-board connector and the first stacked connector are mounted on a same side of the second printed circuit board; and wherein the second printed circuit board is folded back over itself so that the second electronic board-to-board connector and the first stacked connector are vertically placed over a same location on a major face of the first printed circuit board.

The details of one or more embodiments are set forth in the accompanying drawings and the description below.

Other features and advantages will be apparent from the description and drawings, and from the claims.

DESCRIPTION OF THE DRAWINGS

The details of one or more embodiments are set forth in the accompanying drawings and the description below, and wherein.

DETAILED DESCRIPTION

Figure 1:
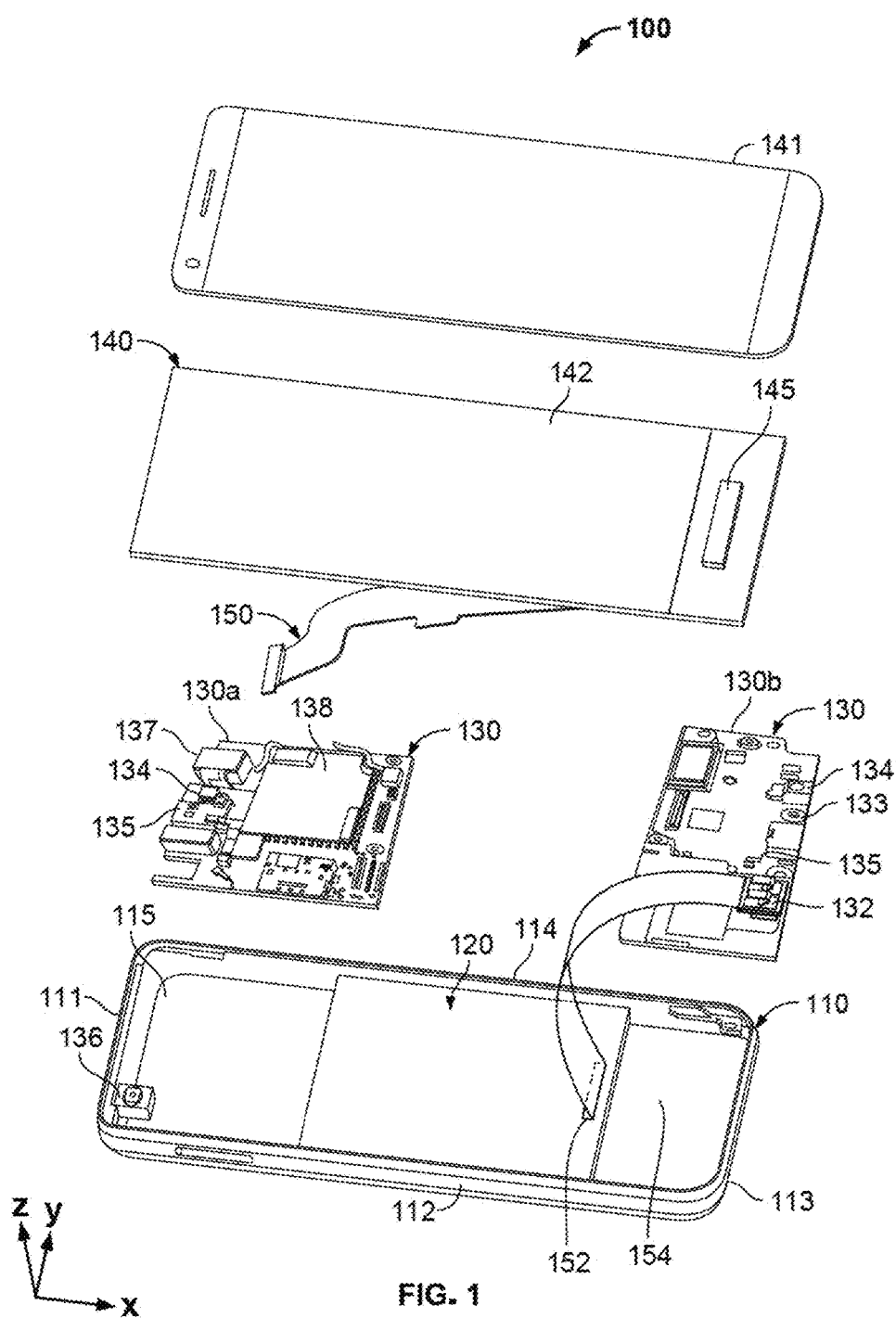
FIG. 1 shows a perspective exploded view of an exemplary electronic device including a connector arrangement positioned between a display assembly and a circuit board.

Referring to FIG. 1, an example electronic device 100 is shown, including an electronic device housing 110, battery 120, circuit board 130 and a display assembly 140. A flexible printed circuit board 154 electrically connects battery 120 with circuit board 130 via a stacked connector arrangement 132 to provide transfer of data and power between battery 120 and circuit board 130 as well as between circuit board 130 and other components (e.g., display assembly 140, other flexible printed circuit boards, or other electronic components). Flexible printed circuit board 154, and the connections between flexible printed circuit board 150, circuit board 130, battery 140 and/or other electronic components through stacked connector arrangement 132 are configured to reduce the space occupied by electronic connectors for these components on circuit board 130, and facilitate flexibility in the arrangement of other components within electronic device 100.

Electronic device housing 110 and an outer cover 141 define an interior volume that can house various components of electronic device 110, including battery 120, circuit board 130, and display assembly 140. Housing 110 can accommodate additional components of electronic device 100, such as microphone 133, speaker 134, sensors 135, such as fingerprint sensors, proximity sensors, accelerometers, and/or other sensors, camera assembly 136, flash devices 137, processor 138, and/or other components. In various embodiments, some or all of these components (e.g., a battery, a universal serial bus (USB) component, a near-field component (NFC), a circuit board, or other electronic component) are electrically connected with circuit board 130 in a space-efficient manner by including stacked connector arrangement 132. For example, depicted device 100 includes connector arrangement 132 to provide space-efficient electrical routing connections between at least some of the various components (e.g., battery 120) and circuit board 130b via flexible printed circuit board 154.

Electronic device housing 110 provides a bucket-type enclosure having first, second, third, and fourth side portions 111, 112, 113, 114 that define outer sidewalls of electronic device 100, and a back major planar face 115 integrally formed with side portions 111, 112, 113, 114. A bucket-type enclosure allows components of electronic device 100 to be accommodated within housing 110 and enclosed by an outer cover, such as outer cover 141. In other embodiments, one or more side portions and/or back major planar face 115 may be formed separately and subsequently joined together (e.g., with one or more adhesives, welds, snap-fit connectors, fasteners, etc.). In various embodiments, electronic device housing 110 may be an H-beam type housing or other electronic device housing 110 that includes one or more walls that provide a housing to at least partially support and/or enclose components of electronic device 100.

Electronic device housing 110 is made from a material that provides adequate structural rigidity to support and protect internal components of electronic device 100. In an example embodiment, electronic device housing 110 is formed from a single piece of metal. Electronic device housing 110 may be milled, molded, forged, etched, printed, or otherwise formed. Alternatively or additionally, electronic device housing 110 may be formed from plastic, glass, wood, carbon fiber, ceramic, combinations thereof, and/or other materials.

Circuit board 130 is configured to accommodate components of electronic device 100 in a space-efficient manner, and provide robust mechanical and electrical connections between these components, such as one or more of microphone 133, speaker 134, sensors 135, camera assembly 136, flash devices 137, processor 138, and/or other components. In some embodiments, circuit board 130 includes a top circuit board 130a, and a bottom circuit board 130b, arranged at respective top and bottom end regions of electronic device 100, for example. Top and bottom circuit boards 130a, 130b are separately formed circuit boards and may be electrically connected by an electrical conductor. In other embodiments, top and bottom circuit boards 130a, 130b are integrally formed as a unitary circuit board (e.g., joined by a third circuit board extending between top and bottom circuit boards 130a, 130b).

Battery 120 may be positioned adjacent to top and/or bottom circuit boards 130a, 130b such that battery 120 is positioned substantially centrally between a top and bottom of electronic device 100 (e.g., between top and bottom sidewalls 111, 113). In other embodiments, battery 120 may be positioned in a stacked configuration such that circuit boards 130a and/or 130b are between battery 120 and display assembly 140 (e.g., sandwiched between battery 120 and display assembly 140), or vice versa.

Battery 120 provides a primary source of power for electronic device 100 and its components. Battery 120 may include a secondary cell, rechargeable battery configured for use through thousands of battery charging cycles over the entire useful life of electronic device 100, for example. In various embodiments, battery 120 may be a lithium polymer battery, lithium ion battery, nickel metal hydride battery, nickel cadmium battery, or other battery type configured to power electronic device 100 over many charging cycles. Alternatively or additionally, battery 120 may include a primary cell battery configured to be replaced when substantially discharged.

Display assembly 140 provides a user interface display that displays information to a user. For example, display assembly 140 may provide a touch screen display that a user can interact with to view displayed information and to provide input to electronic device 100. In an example embodiment, display assembly 140 occupies substantially all or the majority of a front major face of electronic device 100, and includes a rectangular visible display.

Display assembly 140 may include driver circuitry used to control display output and/or receive user input. In some embodiments, driver circuitry includes a display integrated circuit 145 that is mounted in electrical communication with the TFT layers of display panel 142, for example by gate lines or other electrical connection. Display integrated circuit 145 may receive display data from processor 138, for example, and deliver corresponding signals to control the optical properties of a liquid crystal layer, for example, to produce a display output.

Connection between battery 120, circuit board 130 (and particularly processor 138, for example) and other electronic components may be provided by one or more electrical conductors connected through stacked connector arrangement 132, which facilitates a robust electrical connection while maintaining a space-efficient and low profile configuration that does not significantly increase the overall dimensions of electronic device 100. In an example embodiment, flexible printed circuit board 154 connects battery integrated circuit 152 to circuit board 130*b*.

Flexible printed circuit board 154 includes conductive structures on a thin, flexible substrate. Flexible printed circuit board 154 has a relatively thin profile and may be bent along a longitudinal direction to fit between various components within housing 110 of electronic device 100, such as to connect from a back face of battery 120 to circuit board 130 by passing between an side edge of circuit board 130*b* and a bottom sidewall of housing 110. Conductive structures of flexible printed circuit board 154 may include conductive lines, printed conductive traces, or other conductive components that provide electrical connection between respective electrical contacts associated with battery integrated circuit 152 and circuit board 130. Flexible printed circuit board 154 may be a single, double, or multi-layer flexible printed circuit including a polyamide, PEEK, or a polyester, having printed or laminated conductive elements, for example. Such construction provides robust electrical characteristics that can provide reliable connection between various components while having a low bending radius that facilitates compact arrangement of flexible printed circuit board 154 within electronic device 100.

Certain components may be arranged in a stacked configuration within electronic device 100 to reduce the amount of space required to connect those components to the circuit board and/or other electronic components within electronic device 100. For example, certain components may be arranged in stacked connector arrangement 132 within electronic device 100 to reduce the space required to connect battery 120 and other electronic components with circuit board 130. In some embodiments, a battery integrated circuit 152 can be positioned at a bottom portion of battery 120 (e.g., a portion of battery 120 close to bottom wall 113) such that flexible printed circuit board 154 extend over a front side of battery 120 and circuit board 130*b* to connect with circuit board 130*b*. In some embodiments, flexible printed circuit board 154 can extend over circuit board 130*a* instead of circuit board 130*b* to connect with circuit board 103*a*. In some embodiments, battery 120 can include two or more integrated circuits and conductors (not shown) such that one flexible printed circuit board extends over and connects with circuit board 103*a*, and another flexible printed circuit board conduct extends over and connects with circuit board 130*b*.

Electronic device 100 may be an electronic device, for example, a mobile computing device such as a mobile phone, music player, tablet, laptop computing device, wearable electronic device, data storage device, display device, adapter device, desktop computer, or other electronic device.

Figure 2A:
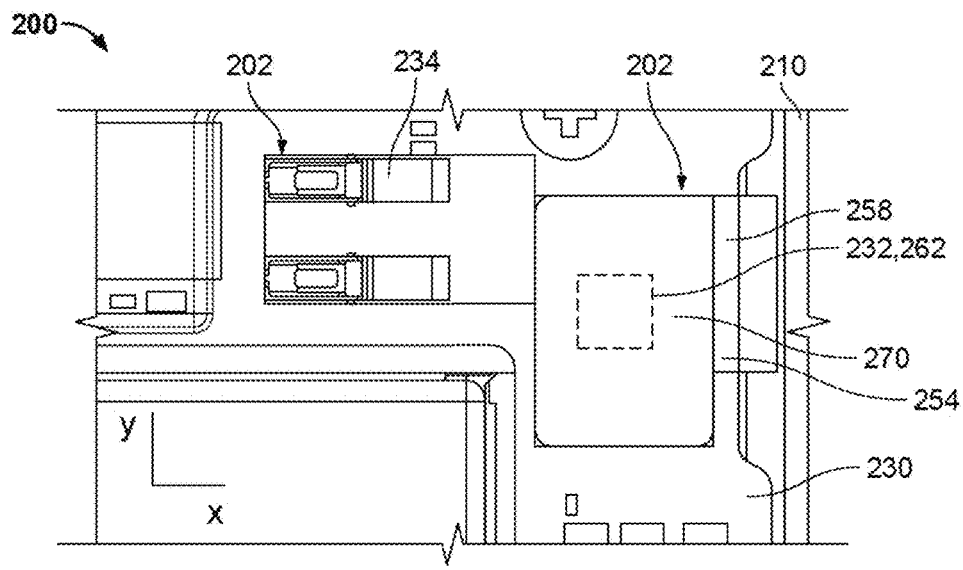
FIGS. 2A and 2B show plan and side perspective views of a first exemplary circuit board connector assembly.
Figure 2B:
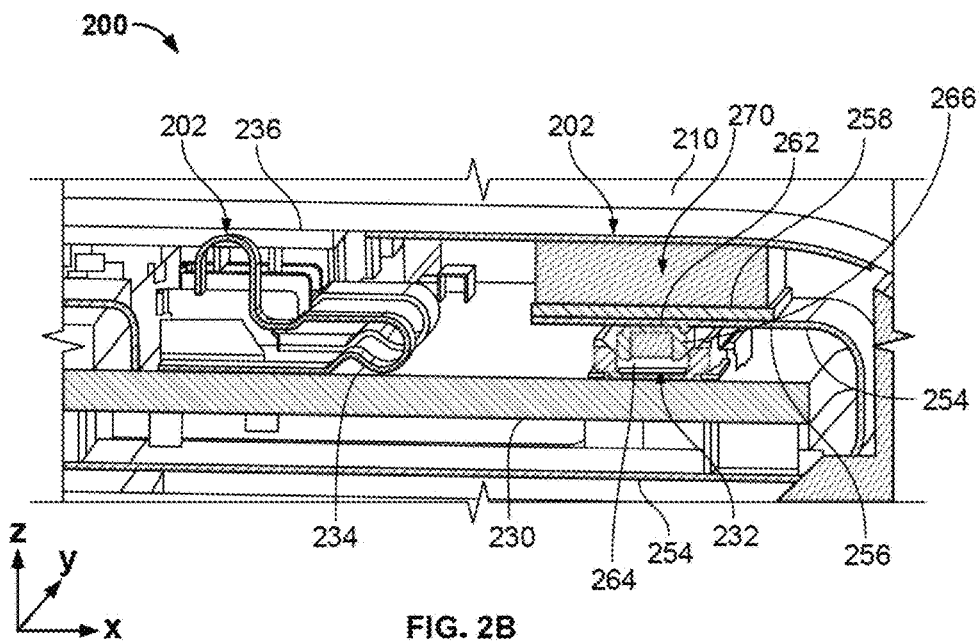

Referring to FIGS. 2A and 2B, an exemplary circuit board connector assembly 202 is shown within an electronic device 200. Circuit board connector assembly 200 includes a first printed circuit board 230, a second printed circuit board 254, a first connector arrangement 232, and a second connector arrangement 234. As shown best shown in FIG. 2B, depicted first and second connector arrangements 232, 234 are positioned between first printed circuit board 230 and housing 210, or another electrical component, such as a third printed circuit board 236. First and second printed circuit boards 230, 254 can each be flexible printed circuit boards, rigid printed circuit boards, or combinations thereof. As shown in FIGS. 2A-2B, certain embodiments of the present disclosure include first printed circuit board 230 being a rigid printed circuit board, and second printed circuit board 254 being a flexible printed circuit board. In some embodiments, first and second printed circuit boards 230, 254 are both rigid, or, alternatively, both flexible printed circuit boards. In some embodiments, first printed circuit board 230 is a flexible printed circuit board and second printed circuit board 254 is a rigid printed circuit board.

Still referring to FIGS. 2A and 2B, first connector arrangement 232 and second connector arrangement 234 can be directly mounted to first printed circuit board 230 at different locations along an X-Y plane (as identified in the figures). First connector arrangement 232 electronically couples first printed circuit board 230 with second printed circuit board 254 that creates an electronic connection between the first printed circuit board 230 and a first electronic component (e.g., battery) within electronic device 200. Second connector arrangement 234 electronically couples first printed circuit board 230 (e.g., a rigid printed circuit board) to a second electronic component (e.g., near-field-communication (NFC) component) within the device. First and second electronic components can include a battery, a universal serial bus (USB) component, an NFC component, a circuit board, or other electronic component within the electronic device 200.

First connector arrangement 232 includes an electronic connector or electronic connection means, such as an electronic board-to-board (B2B) connector assembly 262, and a biasing element 270. B2B connector assembly 262 is mounted to each of first and second printed circuit boards 230, 254 and electronically connects first printed circuit board 230 to a first major face 256 of second printed circuit board 254. Biasing element 270 is mounted to a second major face 258 of second printed circuit board 254 to provide a biasing force that mechanically secures B2B connector assembly 262 (as will be discussed in greater detail in following sections).

Still referring to FIGS. 2A-2B, B2B connector assembly 262 can be mounted to a first face 256 of second printed circuit board 254 and first printed circuit board 230 to electronically connect first printed circuit board 230 with other electronic components within electronic device 200 through conductors of second printed circuit board 254. Biasing element 270 can be coupled to second face 258 of second printed circuit board 254 at a location opposite to B2B connector assembly 262, and between second face 258 of second printed circuit board 254 and a housing 210 of the electronic device. Biasing element 270 applies a biasing force in a direction along the z-axis towards B2B connector assembly 262 to mechanically secure B2B connector assembly 262 (as will be discussed in greater detail in following sections). Biasing element can be a compressive pad or cowling.

B2B connector assembly 262 can be made of two mating components: a first electronic B2B connector 264 and a second B2B connector 266. First electronic B2B connector can be connected to the second electronic B2B connector using a male-to-female connection mechanism. For example, first electronic B2B connector 264 can be a male connector mounted to first printed circuit board 230, and second electronic B2B connector 266 can be a female connector 368 mounted to second printed circuit board 254. Alternatively, in some embodiments, first electronic B2B connector 264 can be a female connector mounted to first printed circuit board 230, while second electronic B2B connector 266 can be a male connector 368 mounted to second printed circuit board 254.

Still referring to FIGS. 2A-2B, biasing element 270 can include a compressible member (such as a pad or a cowling) configured to generate a biasing force against second printed circuit board 254 in a vertical direction towards B2B connector assembly 262 (which will be referred to as a "downward direction"). Biasing element 270 can be mounted to second printed circuit board 254 in a compressive state that causes biasing element 270 to generate the biasing force in the downward direction. The biasing force ensures that the male-to-female connection of B2B connector assembly 262 remains engaged during device use. Biasing element 270 can also help ensure securement of B2B connector assembly 262 in cases when electronic device 200 is subjected to blunt forces generated by external factors (e.g., when electronic device 200 is dropped on the floor).

Second connector arrangement 234 can include an electronic connector or connection means to electrically connect contacts and electrical lines from first printed circuit board 230 to display assembly 240 or other components (e.g., NFS, flash, audio, microphone, or other electronic components) within the electronic device. Second connector arrangement can include a force-biasing connector, for example, a pair of spring connectors. Second connector arrangement 234 can include a body shape configured to bend or compress in a vertical direction along the z-axis. Second connector arrangement 234 can include a variety of other structural shapes to allow flexing or compression in a vertical direction along the z-axis.

Figure 3A:
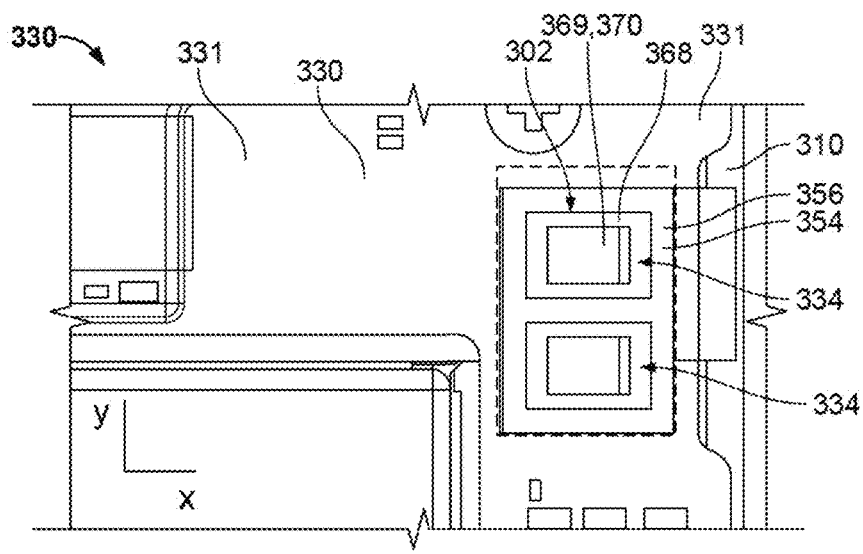
FIGS. 3A-3C show a plan view and side perspective views of a second exemplary circuit board connector assembly.
Figure 3B:
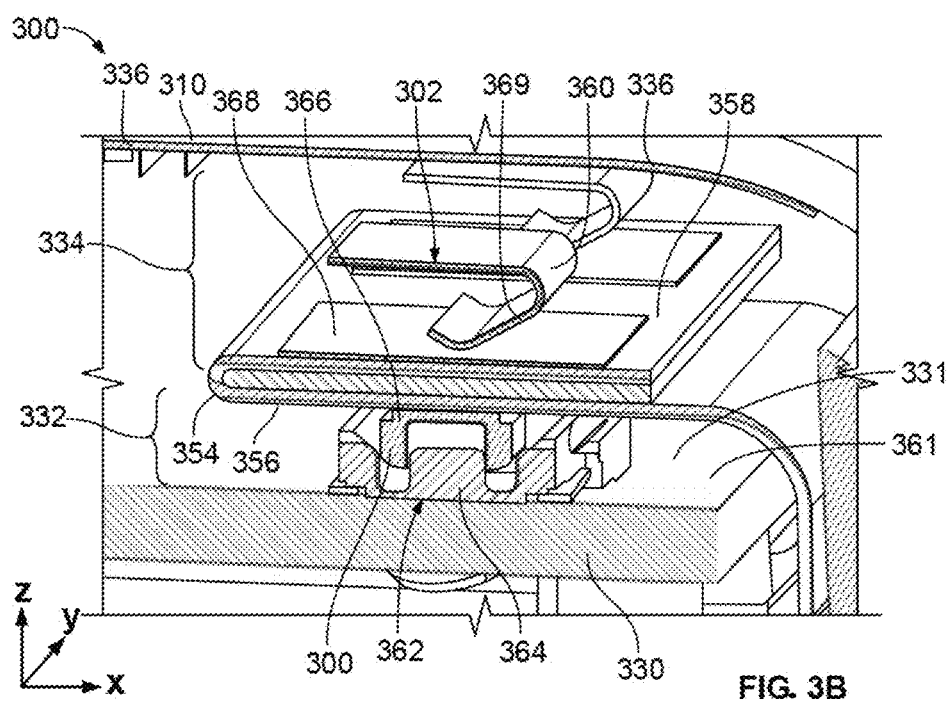
Figure 3C:
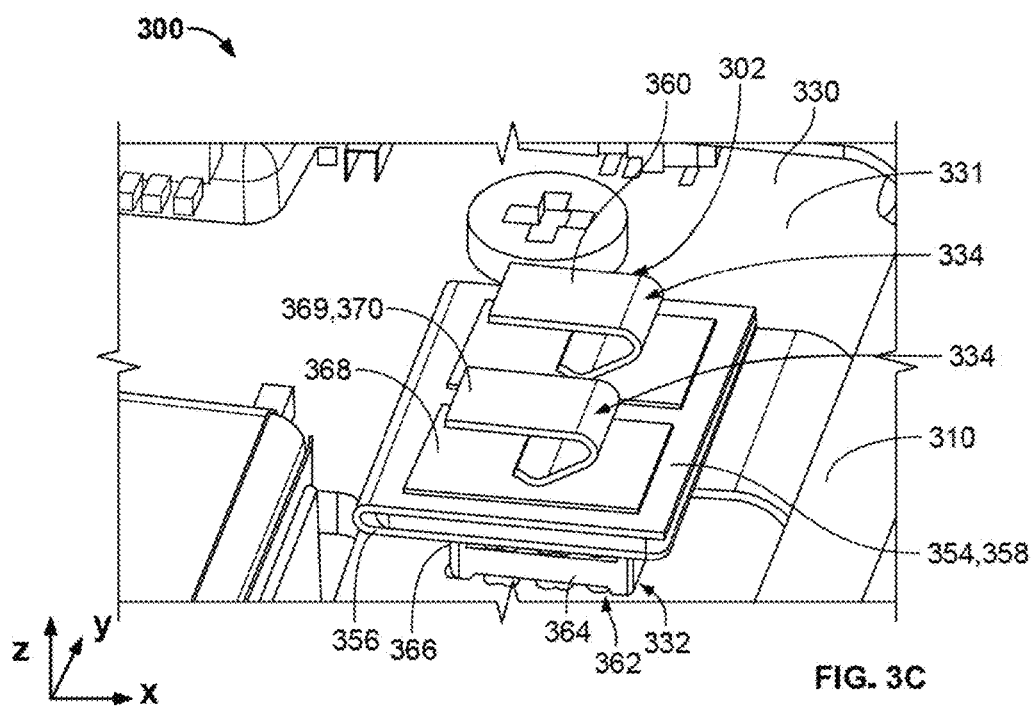

Referring to FIGS. 3A-3C, an exemplary circuit board connector assembly 302 within an electronic device 300 is shown. Circuit board connector assembly 302 includes a first printed circuit board 330, a second printed circuit board 354, a first connector arrangement 332, and a second connector arrangement 334. As shown, first and second connector arrangements 332,334 are positioned between first printed circuit board 230 and a device housing 310 (e.g., housing with a third printed circuit board mounted thereto as shown in FIG. 2B) in a vertically stacked configuration. The vertically stacked first and second connector arrangements 332, 334 increase space-efficiency of first printed circuit board 330. As shown, first and second connector arrangements 332, 334 may be positioned on opposite face sides of second printed circuit board 354 such that second connector 334 is positioned vertically along the z-axis directly above first connector arrangement 332.

Circuit board connector assembly 302 also has several features that are different than the features of circuit board connector assembly 202. For example, circuit board connector assembly 302 includes vertically stacked electronic connectors, for example, in which second connector arrangement 334 is arranged vertically above (along the z-axis) first connector arrangement 332 and on an opposite major face (e.g., second major face 358) of second printed circuit board 354 than first connector arrangement 332. Also, certain embodiments of circuit board connector assembly 302 electronically connect first printed circuit board 330 (e.g., a rigid printed circuit board) to a first electronic component (e.g., battery) and a second electronic component 336 (e.g., third printed circuit board, NFC component) through conductors (e.g., electrical traces, pins, pads) of second printed circuit board 354 that are configured to send data signals. Second connector arrangement 334 can also include a biasing member that generates a biasing force along the z-axis in a direction toward first connector arrangement 332. These differences allow circuit board connector assembly 302 to securely couple first printed circuit board 330 to second printed circuit board 354, while producing electronic connections between first printed circuit board 330 and other electronic components (e.g., third printed circuit board, battery, or NFC) within device 300 in a space-efficient manner. In the various implementations discussed herein, circuit board connector assembly 302 can provide the advantage of electronically connecting a given printed circuit board to multiple electronic components within device 300 while minimizing the needed space along the X-Y plane of that given printed circuit board to make the necessary electronic connections.

Still referring to FIGS. 3A-3C, first and second printed circuit boards 330,354 can be rigid printed circuit boards or flexible printed circuit boards, or combinations thereof. As shown in FIGS. 3A-3C, in certain embodiments of the present disclosure, first printed circuit board 330 is a rigid printed circuit board, and second printed circuit board 354 is a flexible printed circuit board. In some embodiments, first and second printed circuit board 330, 354 are both rigid printed circuit boards, or both flexible printed circuit boards. In some embodiments, first printed circuit board 330 is a flex conductor and second printed circuit board 354 is a rigid printed circuit board.

First connector arrangement 332 can be positioned between first printed circuit board 330 and second printed circuit board 354 (see FIG. 3B) to connect first printed circuit board 330 with other electronic components (e.g., battery) within electronic device 300 via second printed circuit board 354. First connector arrangement 332 can include an electronic connector or electronic connection means, such as an electronic board-to-board (B2B) connector assembly 362, to electronically connect first and second printed circuit boards 330, 354.

Still referring to FIGS. 3A-3C, B2B connector assembly 362 can be mounted to a first face 356 of second printed circuit board 354 and a major face 331 of first printed circuit board 330 to electronically connect first printed circuit board 230 with other components (e.g., a battery) within electronic device 300 through the electronic conductors of second printed circuit board 354. B2B connector assembly 362 can include two mating parts: a first electronic B2B connector 364 and a second B2B connector 366. The first electronic B2B connector 364 can be configured to connect to the second electronic B2B connector 366 through movement in a direction that is transverse to a major face 331 of the first circuit board.

In some embodiments, first and second electronic B2B connectors 364,366 are a set of male and female board-to-board connectors. In some embodiments, first electronic B2B connector 364 can be a male connector mounted to first printed circuit board 330 and second electronic B2B connector 366 can be a female connector mounted to second printed circuit board 354. Alternatively, in some embodiments, electronic B2B connector 364 can be a female connector mounted to first printed circuit board 330 and second electronic B2B connector 366 can be a male connector mounted to second printed circuit board 354. First and second electronic B2B connectors 364, 366 can be mounted to their respective printed circuit boards by using joining techniques such as soldering, adhesive bonding, and heat bonding.

Still referring to FIGS. 3A-3C, circuit board connector assembly 302 includes second connector arrangement 334 positioned on an opposite major face of second printed circuit board 354 and vertically above first connector arrangement 332. Second connector arrangement 334 can include a first stacked connector 368 and a second stacked connector 369. In some embodiments, first stacked connector 368 can be mounted to second printed circuit board 354 and second stacked connector 369 can be connected to first stacked connector 368. First stacked connector 368 may be fixedly mounted to second face 358 of second printed circuit board 354, which is opposite to the face coupled to first connector arrangement 332. In some embodiments, first stacked connector 368 can include one or more conductive pads (e.g., gold-plated pad), pogos, or pins mounted on or integrated with second printed circuit board 354.

Fourth connector 369 of second connector arrangement 334 can be either fixedly or releasably coupled to first stacked connector 368. Second stacked connector 369 can include one or more spring connectors configured to electronically couple the conductors of second printed circuit board 354 with the conductors of second electronic component 336, such as a third printed circuit board.

Still referring to FIGS. 3A-3C, second stacked connector 369 can include a biasing member 370. In some embodiments, either first stacked connector 368 or second stacked connector 369, or both can include biasing member 370. The biasing member 370 can have a body shape configured for generating a biasing force in a direction along the z-axis, e.g., a spring or clip connector. In some embodiments, biasing member 370 can bias first board-to-board electronic connector 364 together with the second electronic board-to-board connector 366 by applying a biasing force to the first stacked connector 368 that biases the first printed circuit board 330 and thus biases the first board-to-board electronic connector 364 together with the second electronic board-to-board connector 366.

In certain implementations, second connector arrangement 334 can include biasing member 370 as a separate component in addition to first and second stacked connectors 368, 369. In some embodiments, first stacked connector 368 and/or second stacked connector 369 can be mounted to biasing member 370. For example, in some embodiments, biasing member 370 can be included a separate component (e.g., such as a compressive foam, pad, or cowling) coupled to second stacked connector 369 to provide a biasing force that biases first B2B electronic connector 364 together with second B2B connector 366, and first stacked connector 368 together with second stacked connector 369.

Figure 4:
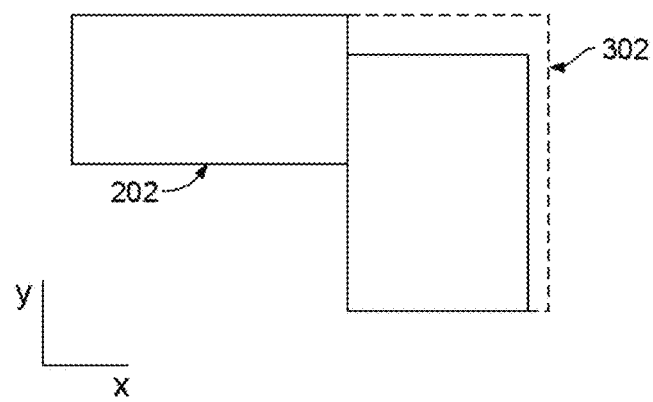
FIG. 4 shows a plan view schematic comparison of the space occupied by the first and second exemplary circuit board connector assemblies of FIGS. 2A-2B and FIGS. 3A-3C.

FIG. 4 shows a comparison of space along an X-Y plane occupied by circuit board connector assembly 202 (FIGS. 2A-2B) and circuit board connector assembly 302 (FIGS. 3A-3B). As shown, circuit board connector assembly 302 occupies significantly less space than circuit board connector assembly 202. FIG. 4 illustrates how circuit board connector assembly 302, which includes vertically stacked connectors, can save substantial amount of space along a planar region of a given circuit board, thus freeing up space for connecting other electronic connectors and/or allowing for a reduced overall size of the circuit board.

Figure 5A:
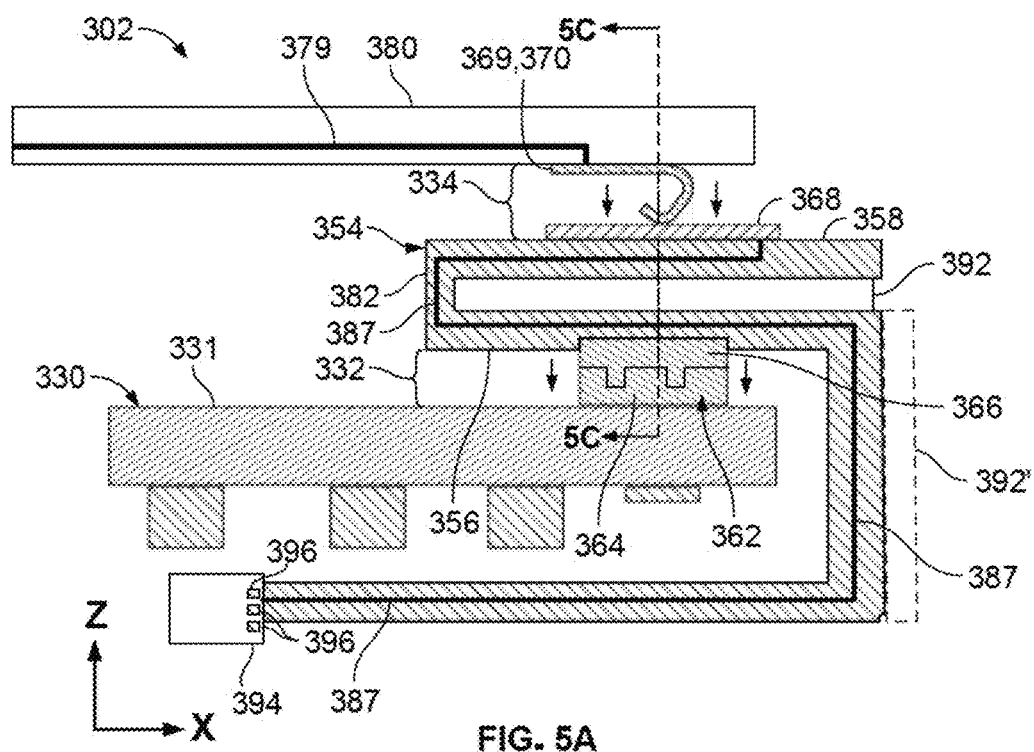
FIGS. 5A-5C show side, front, and cross-sectional transverse views of the second exemplary circuit board connector assembly of FIGS. 3A-3C.
Figure 5B:
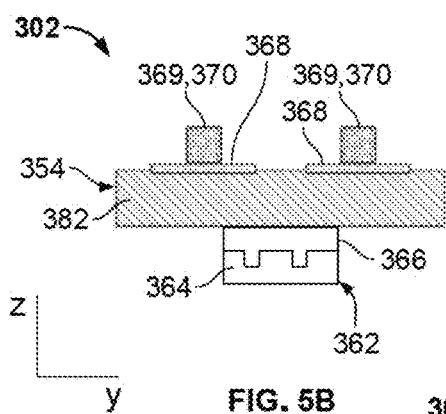
Figure 5C:
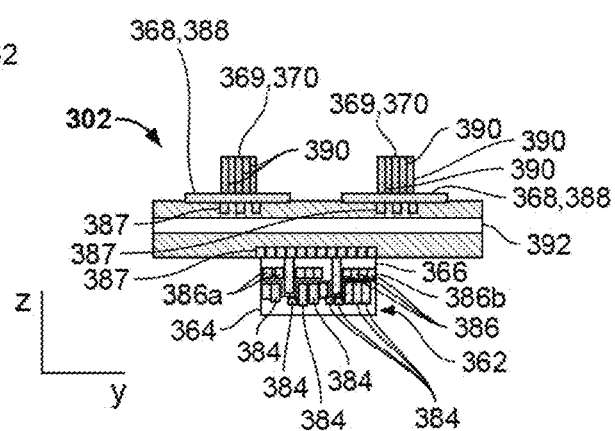

Referring to FIGS. 5A-5C, circuit board connector assembly 302 of electronic device 300 is shown with certain internal features of the assembly 302 depicted. FIGS. 5A and 5B show side and front views, respectively, and FIG. 5C shows a cross-sectional front view of circuit board connector assembly 302. Circuit board connector assembly 302 includes first printed circuit board 330 having major face 331. Electronic connectors of first connector arrangement 332, such as B2B connector assembly 362, can be mounted to major face 331 of first printed circuit board 330 and first major face 356 of second printed circuit board 354. Furthermore, first stacked connector 368 can be coupled to electrical connectors 379 of a third printed circuit board 380 (e.g., a flexible printed circuit board) via second stacked connector 369. As best shown in FIG. 5A, B2B connector assembly includes first electronic B2B connector 364, which is configured to connect to second electronic B2B connector 366 through movement in a direction (see arrow depictions) that is transverse to major face 331 of the first printed circuit board 330.

Electronic connectors of second connector arrangement 334, such as first stacked connector 368 and second stacked connector 369, can be mounted to second major face 358 to connect first printed circuit board 330 to third printed circuit board 380 via second printed circuit board 354. In some embodiments, first stacked connector 368 can be configured to connect to second stacked connector 369 through movement in a direction (see arrows) that is transverse to the major face 331 of the first printed circuit board 330 generated by biasing member 370. First stacked connector 368 and/or second stacked connector 369 can be connected to biasing member 370, or, alternatively, include a biasing member 370. Biasing member 370 biases the first B2B electronic connector 364 together with the second electronic B2B connector 366 and the first stacked connector 368 together with the second stacked connector 369 by applying a biasing force in the direction that is transverse (see arrow depictions) to the major face 331 of the first printed circuit board 330.

As best shown in FIG. 5A, in some embodiments, second printed circuit board 354 is a flexible printed circuit board arranged in a folded configuration that has a first major face 356 and a second major face 358. Electronic connectors of second connector arrangement 334 (e.g., such as B2B connector assembly 362, first stacked connector 368, and second stacked connector 369) can be mounted to first and second major faces 356, 358 of second printed circuit board 354. In the folded configuration, second printed circuit board 354 overlaps over itself and forms a fold portion 382. A portion of second printed circuit board 354 proximal to fold portion 382 forms first major face 356, and a portion of second printed circuit board 354 distal to fold portion 382 forms second major face 358. When in the folded configuration, electronic connectors can be positioned on first and/or second major faces 356, 358 of second printed circuit board 354. In some embodiments, second electronic board-to-board connector 366 and the first stacked connector 368 can be mounted on a same side of the second printed circuit board 354 such that the second printed circuit board 354 is folded back over itself so that the second electronic B2B connector 366 and the first stacked connector 368 are vertically placed over a same location or area (of the X-Y plane) on major face 331 of the first printed circuit board 330.

Still referring to FIGS. 5A-5C, first connector arrangement 332 can include electronic connectors having one or more electronic conductors, such as electrical traces or pins. In particular, first and second electronic B2B connectors 364, 366 can each include at least one electronic conductor. In some embodiments, first electronic B2B connector 364 includes a first plurality of conductors 384 (for example, three, four, five, ten, twenty, thirty, forty, fifty, or more than fifty conductors). In some embodiments, second electronic B2B connector 366 includes a second plurality of conductors 386 (e.g., three, four, five, ten, twenty, thirty, forty, fifty, or more than fifty conductors). The first plurality of conductors 384 can connect to the second plurality of conductors 386 when first electronic B2B connector 364 is connected to the second electronic B2B connector 366.

Second connector arrangement 334 can include electronic connectors having one or more electronic conductors, such as electrical traces, pins, or pads. In some embodiments, first stacked connector 368 can include a third set (or a third plurality) of conductors 388, which is electrically connected to the second set (or a second plurality) of conductors 384 of first electronic B2B connector 364. In some embodiments, a first subset of the second set of conductors 386a are electrically connected with the third set of conductors 388 without being connected to a conductor of any other electronic connector. In some embodiments, first stacked connector 368 can includes a third set (or a third plurality) of multiple conductors 388, and second stacked connector 369 includes a fourth set of multiple conductors 390. The third set of multiple conductors 388 can connect with the fourth set of multiple conductors 390 when first stacked connector 368 is connected together with the second stacked connector 369.

As best shown in FIG. 5A, circuit board connector assembly 302 can include an additional electronic connector, such as an electronic component connector 394 (e.g., a battery connector) mounted to second printed electronic circuit board 354. For example, flexible printed circuit board 354 may be electronically coupled to B2B connector assembly 362 at one end and extend therefrom and around printed circuit board 330 to attach with electronic component connector 394 (e.g., battery connector) at the other end. The electronic component connector can include one or more conductors. In some embodiments, electronic component conductor 394 includes a fifth set of conductors 396 that are electrically connected to all of or a portion of the second plurality of conductors 386 (e.g., conductors of second electronic B2B connector 366).

Still referring to FIGS. 5A-5C, any one of the sets of conductors (e.g., second set of conductors 384) can include multiple subsets of conductors that extend in different directions, and/or couple to different electronic components. For example, some of the conductors of second B2B connector 364 can route to the set of connectors that are stacked above the B2B connector assembly 362, while other of the conductors route down the flexible printed circuit board 354 to another connector (e.g., a connector located 2 or more centimeters away and not vertically stacked with first and second B2B connectors 364, 366). In some embodiments, a first subset of the second set of conductors 386a of second electronic B2B connector 386b can be electrically connected with one set of conductors (e.g., a third set of conductors 388), while a second subset of second plurality of conductors 386b of second electronic B2B connector 386b can be electrically connected with a different set of conductors. First and second subsets of second set of conductors 386a can be electrically connected with the third set of conductors 388 through electrical tracings 387 on or within second printed circuit board 354.

As best shown in FIGS. 5A and 5C, second printed circuit board 354 can optionally include at least one support structure 392 to provide mechanical support to the flexible body of second printed circuit board 354 and to help provide stability for the conductors connected to second printed circuit board 354. In some embodiments, support element 392 is sandwiched between inner-facing major faces of the folded portion of second printed circuit board 354. In some embodiments, support element 392' is positioned adjacent to non-folded portions second printed circuit board 354, e.g., a portion of second printed circuit board 354 extending vertically along the Z plane. In some embodiments, support element 392 can be disposed on second major face 356 of second printed circuit board 354 (see FIG. 6A). Support element 392 can provide mechanical strength to the flexible second printed circuit board 354, which helps ensure second printed circuit board 354 maintains its position at a desired location and/or maintain a desired shape within electronic device 300. Flexible printed circuit boards typically have a thickness that ranges from about 0.08 inches to about 0.30 inches, depending on the number of conductive layers and construction characteristics of the flex. In some embodiments, support structure 392 comprises select portions of second printed circuit board 354 having a thicker wall (e.g., a wall thickness greater than 0.30 inches). In some embodiments, support structure 392 includes at least one cavity or opening that allows one or more conductors to be received therein or pass therethrough. Support structure 392 can help to protect the electrical conductors within the flex conductor, such as wires, solder points, pins, and pads from damage that might otherwise be caused by flexure fatigue during device use.

Support structure 392 can be made of one or more metals (e.g., such as stainless steel, titanium, platinum, copper, gold, or alloys or combinations thereof), polymers (e.g., such as polyamide, or PEEK), ceramics (such as silicon), or combinations thereof. An entire portion or a select portion of support structure 392 can be conductive or non-conductive. In some embodiments, support structure 392 is made of the same materials as first and/or second printed circuit boards 330, 354.

Figure 6A:
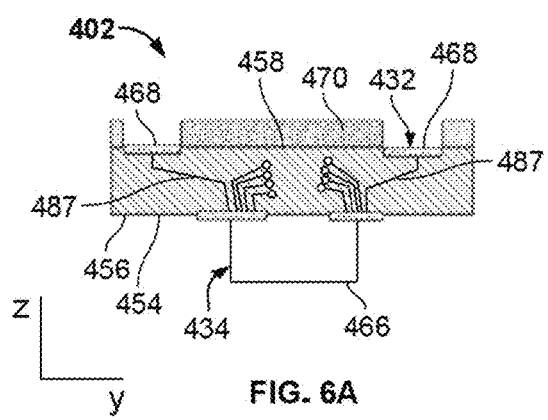
FIGS. 6A-6B show cross-sectional transverse and top views of a third exemplary circuit board connector assembly.
Figure 6B:
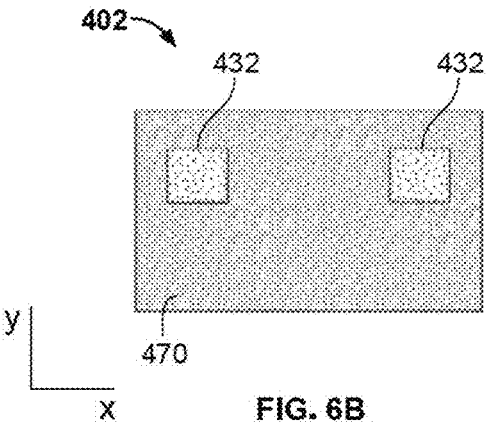

Referring to FIGS. 6A-6B, an exemplary embodiment of a circuit board connector assembly 402 showing a flexible printed circuit board 454 with vertically stacked electronic connectors that include a first connector arrangement 432 and a second connector arrangement 434. Flexible printed circuit board 454 has several similar features to the previous embodiments disclosed herein. However, unlike previous shown embodiments, the portion of flexible printed circuit board 454 coupled to the connectors 432, 434 of circuit board connector assembly 402 is substantially straight (without any folds). Flexible printed circuit board 454 can optionally include a support structure 470 disclosed herein that is disposed on an upper major face of flexible printed circuit board 454. Support structure 470 can includes apertures ("vias") to allow access to conductors (e.g., pin, pads, and/or electrical tracings) mounted on and/or integrated within flexible printed circuit board 454.

Second printed circuit board 454 has a first major face 456 and a second major face 458 configured for receiving electronic connectors. An electronic B2B connector 466 and a gold pad electronic connector 468 are mounted on opposite major faces 456, 458 of flexible printed circuit board 454. A plurality of conductors 487, e.g., data transmission electrical lines, can pass through the body of the flexible printed circuit board 454 (e.g., data transmission electrical lines are configured in a path that generally extends from electronic contacts (e.g., pins) of electronic B2B connector 466 to gold pad electronic connectors 468. Thus, in the straight configuration, flexible printed circuit board 454 can include electronic conductors 487 that extend generally from first major face 456 to second major face 458 through the body of second printed circuit board 454. In FIG. 6A these conductors are illustrated as flowing in the same Y-Z plane, but they may flow in all three dimensions (e.g., conductors can extend "into the page" as depicted by the circle with "x") in order to maximize the amount of conductors that can connect the first connector arrangement 432 to the second connector arrangement 434.

While this specification contains many specific implementation details, these should not be construed as limitations on the scope of the disclosed technology or of what may be claimed, but rather as descriptions of features that may be specific to particular embodiments of particular disclosed technologies. Certain features that are described in this specification in the context of separate embodiments can also be implemented in combination in a single embodiment in part or in whole. Conversely, various features that are described in the context of a single embodiment can also be implemented in multiple embodiments separately or in any suitable subcombination. Moreover, although features may be described herein as acting in certain combinations and/or initially claimed as such, one or more features from a claimed combination can in some embodiments be excised from the combination, and the claimed combination may be directed to a subcombination or variation of a subcombination. Similarly, while operations may be described in a particular order, this should not be understood as requiring that such operations be performed in the particular order or in sequential order, or that all operations be performed, to achieve desirable results. Particular embodiments of the subject matter have been described. Other embodiments are within the scope of the following claims.

What is claimed is:

1. A mobile computing device, comprising:
   a first printed circuit board;
   a first electronic board-to-board connector mounted to the first printed circuit board;
   a second printed circuit board;
   a second electronic board-to-board connector mounted to the second printed circuit board and connected to the first electronic board-to-board connector;
   a first stacked connector mounted to the second printed circuit board;
   a second stacked connector connected to the first stacked connector; and
   a biasing member that biases:
   (i) the first electronic board-to-board connector together with the second electronic board-to-board connector, and
   (ii) the first stacked connector together with the second stacked connector.

2. The mobile computing device of claim 1, wherein the first electronic board-to-board connector is connected to the second electronic board-to-board connector by a male-to-female connection mechanism.

3. The mobile computing device of claim 1, wherein:
   the first electronic board-to-board connector is configured to connect to the second electronic board-to-board connector through movement in a direction transverse to a major face of the first printed circuit board;
   the first stacked connector is configured to connect to the second stacked connector through movement in the direction transverse to the major face of the first printed circuit board;
   the biasing member biases the first electronic board-to-board connector together with the second electronic board-to-board connector and the first stacked connector together with the second stacked connector by applying a biasing force in the direction transverse to the major face of the first printed circuit board.

4. The mobile computing device of claim 1, wherein:
   the first printed circuit board is a rigid printed circuit board; and
   the second printed circuit board is a flexible printed circuit board.

5. The mobile computing device of claim 1, further comprising an electronic component connector mounted to the second printed circuit board, wherein:
   the first electronic board-to-board connector includes a first plurality of conductors;
   the second electronic board-to-board connector includes a second plurality of conductors;
   the first plurality of conductors connect to the second plurality of conductors when the first electronic board-to-board connector is connected to the second electronic board-to-board connector;
   the first stacked connector includes a third plurality of conductors that are electrically connected to a first subset of the second plurality of conductors; and
   the electronic component connector includes a fourth plurality of conductors that are electrically connected to a second subset of the second plurality of conductors.

6. The mobile computing device of claim 5, wherein the first subset of the second plurality of conductors are electrically connected with the third plurality of conductors without being connected to a conductor of any other electronic connector.

7. The mobile computing device of claim 1, wherein:
   the first stacked connector includes a third plurality of multiple conductors;
   the second stacked connector includes a fourth plurality of multiple conductors; and
   the third plurality of multiple conductors connect with the fourth plurality of multiple conductors when the first stacked connector is connected together with the second stacked connector.

8. The mobile computing device of claim 1, wherein the second electronic board-to-board connector and the first stacked connector are mounted opposite each other on different sides of the second printed circuit board.

9. The mobile computing device of claim 1, wherein:
   the second electronic board-to-board connector and the first stacked connector are mounted on a same side of the second printed circuit board;
   the second printed circuit board is folded back over itself so that the second electronic board-to-board connector and the first stacked connector are vertically placed over a same location on a major face of the first printed circuit board.

10. The mobile computing device of claim 9, further comprising a support structure disposed between interior major surfaces of folded portions of the second printed circuit board.

11. The mobile computing device of claim 1, wherein first stacked connector or the second stacked connector comprises the biasing member.

12. The mobile computing device of claim 1, wherein the first stacked connector or the second stacked connector is mounted to the biasing member.

13. The mobile computing device of claim 1, wherein the biasing member biases the first electronic board-to-board connector together with the second electronic board-to-board connector by applying a biasing force to the first stacked connector that biases the first printed circuit board and thus biases the first electronic board-to-board connector together with the second electronic board-to-board connector.

14. An assembly of electrical components, comprising:
a first printed circuit board is a rigid printed circuit board;
a first electronic board-to-board connector mounted to the first printed circuit board;
a second printed circuit board is a flexible printed circuit board;
a second electronic board-to-board connector mounted to the second printed circuit board and connected to the first electronic board-to-board connector using a male-to-female connection mechanism;
a first stacked connector mounted to the second printed circuit board; and
a second stacked connector connected to the first stacked connector;
wherein the first electronic board-to-board connector is configured to connect to the second electronic board-to-board connector through movement in a direction transverse to a major face of the first printed circuit board;
the first stacked connector is configured to connect to the second stacked connector through movement in the direction transverse to the major face of the first printed circuit board; and
wherein a biasing member biases by applying a biasing force in the direction transverse to the major face of the first printed circuit board:
(i) the first electronic board-to-board connector together with the second electronic board-to-board connector, and
(ii) the first stacked connector together with the second stacked connector.

15. The assembly of claim 14, further comprising an electronic component connector mounted to the second printed circuit board; and wherein:
the first electronic board-to-board connector includes a first plurality of conductors;
the second electronic board-to-board connector includes a second plurality of conductors;
the first plurality of conductors connect to the second plurality of conductors when the first electronic board-to-board connector is connected to the second electronic board-to-board connector;
the first stacked connector includes a third plurality of conductors that are electrically connected to a first subset of the second plurality of conductors; and
the electronic component connector includes a fourth plurality of conductors that are electrically connected to a second subset of the second plurality of conductors.

16. The assembly of claim 15, wherein the first subset of the second plurality of conductors are electrically connected with the third plurality of conductors without being connected to a conductor of any other electronic connector.

17. The assembly of claim 14, wherein:
the first stacked connector includes a third plurality of multiple conductors;
the second stacked connector includes a fourth plurality of multiple conductors; and
the third plurality of multiple conductors connect with the fourth plurality of multiple conductors when the first stacked connector is connected together with the second stacked connector.

18. The assembly of claim 14, wherein first stacked connector or the second stacked connector comprises the biasing member.

19. The assembly of claim 14, wherein the biasing member biases the first electronic board-to-board connector together with the second electronic board-to-board connector by applying a biasing force to the first stacked connector that biases the first printed circuit board and thus biases the first electronic board-to-board connector together with the second electronic board-to-board connector.

20. An assembly of electrical components, comprising:
a first printed circuit board;
a first electronic board-to-board connector mounted to the first printed circuit board;
a second printed circuit board;
a second electronic board-to-board connector mounted to the second printed circuit board and connected to the first electronic board-to-board connector using a male-to-female connection mechanism;
a first stacked connector mounted to the second printed circuit board; and
a second stacked connector connected to the first stacked connector;
wherein the second electronic board-to-board connector and the first stacked connector are mounted on a same side of the second printed circuit board; and
wherein the second printed circuit board is folded back over itself so that the second electronic board-to-board connector and the first stacked connector are vertically placed over a same location on a major face of the first printed circuit board.

* * * * *